United States Patent
Huang et al.

(10) Patent No.: US 6,174,802 B1
(45) Date of Patent: Jan. 16, 2001

(54) METHOD FOR FABRICATING A SELF ALIGNED CONTACT WHICH ELIMINATES THE KEY HOLE PROBLEM USING A TWO STEP CONTACT DEPOSITION

(75) Inventors: Kuo-Ching Huang, Kaohsiung; Tse-Liang Ying; Wen-Chuan Chiang, both of Hsin-Chu; Min-Hsiung Chiang, Taipei, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/342,042

(22) Filed: Jun. 28, 1999

(51) Int. Cl.⁷ .................................................. H01L 21/4763
(52) U.S. Cl. .......................... 438/637; 438/639; 438/666; 438/239; 438/381
(58) Field of Search ..................................... 438/637, 639, 438/666, 239, 381, 393, 396, 250, 253

(56) References Cited

U.S. PATENT DOCUMENTS

| | | | |
|---|---|---|---|
| 5,114,530 | * 5/1992 | Rao et al. ............................. | 438/637 |
| 5,266,525 | * 11/1993 | Morozumi ............................. | 438/637 |
| 5,275,972 | * 1/1994 | Ogawa et al. ........................ | 438/639 |
| 5,480,814 | 1/1996 | Wau et al. ............................. | 437/41 |
| 5,739,068 | * 4/1998 | Jost et al. ............................. | 438/637 |
| 5,763,303 | 6/1998 | Liaw et al. ............................. | 438/210 |
| 5,795,827 | 8/1998 | Liaw et al. ............................. | 438/663 |
| 5,824,562 | * 10/1998 | Park ...................................... | 438/637 |
| 5,843,815 | 12/1998 | Liaw ..................................... | 438/238 |
| 5,953,635 | * 9/1999 | Andideh ............................... | 438/637 |
| 6,015,730 | * 1/2000 | Wang et al. .......................... | 438/241 |
| 6,025,260 | * 2/2000 | Lien et al. ............................. | 438/637 |
| 6,033,981 | * 3/2000 | Lee et al. .............................. | 438/624 |

* cited by examiner

Primary Examiner—John F. Niebling
Assistant Examiner—Lynne A. Gurley
(74) Attorney, Agent, or Firm—George O. Saile; Stephen B. Ackerman; William J. Stoffel

(57) ABSTRACT

A method for forming a self aligned contact without key holes using a two step contact deposition. The process begins by providing a semiconductor structure having conductive structures (such as bit lines) thereover with sidewalls and having a contact area adjacent to the conductive structures. The conductive structures comprise at least one conductive layer with a hard mask thereover. A spacer layer is formed over the hard mask and the substrate structure and anisotropically etched to form sidewall spacers on the sidewalls of the conductive structure. A second dielectric (IPO) layer is formed over the sidewall spacers, the hard mask, and the substrate structure, whereby the second dielectric layer has a keyhole. A contact opening is formed in the second dielectric layer over the contact area. A first contact layer having poor step coverage is formed in the contact openings and over the second dielectric layer, thereby plugging the keyhole without filling it. A second contact layer is formed over the first contact layer.

13 Claims, 6 Drawing Sheets

METHOD FOR FABRICATING A SELF ALIGNED CONTACT WHICH ELIMINATES THE KEY HOLE PROBLEM USING A TWO STEP CONTACT DEPOSITION

BACKGROUND OF THE INVENTION

1. Field of the Invention

This invention relates generally to fabrication of semiconductor devices and more particularly to a two step process for forming a self-aligned contact, preferably composed of polysilicon, which eliminates the key hole problem in the IPO (inter-poly oxide) layer.

2. Description of the Prior Art

The use of self aligned contact (SAC) processes has resulted in higher performing, lower cost, and increased density semiconductor devices. In a self-aligned contact process, spacers are formed on the sidewalls of conductive structures (such as gates and bit lines). An IPO layer is formed over these conductive structures. A contact opening is etched through the IPO. A conductive layer, such as for capacitor crowns, is formed over the conductive structures and in the contact opening. However, as device dimensions and die sizes continue to decrease for higher density, the space between adjacent conductive structures becomes narrower. The surface of the sidewall spacers facing the contact opening become concave which leads to voids or keyholes in the subsequently formed IPO layer. The key holes can fill with conductive material during subsequent formation of a conductive contact layer causing two separate devices (such as capacitors) which are formed over the IPO layer to short. The short can result in cell failure.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,480,814 (Wuu et al.) shows a SAC with a barrier layer formed of polysilicon and a contact layer formed of a silicide.

U.S. Pat. No. 5,763,303 (Liaw et al.) shows a SAC with a polysilicon layer, a silicide layer and a contact.

U.S. Pat. No. 5,795,827 (Liaw et al.) shows a SAC with triple polysilicon.

U.S. Pat. No. 5,843,815 (Liaw) shows a SAC with a halo implant.

SUMMARY OF THE INVENTION

It is an object of the present invention to provide a method for fabricating a self aligned contact using a two-step polysilicon deposition.

It is another object of the present invention to provide a method for forming a self-aligned contact which solves the keyhole problem.

It is another object of the present invention to provide a method for forming a self aligned contact which avoids capacitor crown to crown shorting by using a two-step polysilicon deposition.

It is yet another object of the present invention to provide a method for forming a self aligned contact using a two-step polysilicon deposition which is easy to integrate with current processes.

To accomplish the above objectives, the present invention provides a method for forming a self-aligned contact without key holes using a two step contact deposition. The process begins by providing a semiconductor structure having a conductive structure (such as a bit line) thereover with sidewalls and having a contact area adjacent to the conductive structure. The conductive structure comprises at least one conductive layer with a hard mask thereover. A spacer layer is formed over the hard mask and the semiconductor structure and anisotropically etched to form sidewall spacers on the sidewalls of the conductive structure. A second dielectric (e.g. IPO) layer is formed over the sidewall spacers, the hard mask, and the semiconductor structure. A contact opening is formed in the second dielectric layer over the contact area. A first conductive contact layer having poor step coverage properties is formed in the contact openings, thereby plugging the keyhole openings without filling the keyhole. A second conductive contact layer is formed over the first conductive contact layer. The first conductive contact layer and the second conductive contact layer can be used to form conductive structures such as capacitor crowns which do not have an electrical short through the IPO layer.

The present invention provides considerable improvement over the prior art. Most significantly, the keyhole which is formed in the IPO layer is plugged by the first contact layer without being filled with a conductive material, thereby preventing an electrical short between adjacent structures.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 2A, 3A, 4A, 5A & 6A are taken along axis 2A-2A' in FIG. 1. FIGS. 2B, 3B, 4B, 5B & 6B are taken along axis 2B-2B' in FIG. 1. FIGS. 7 & 8 are taken along axis 7-7' in FIG. 1.

FIGS. 9 & 10 are taken along axis 7-7' in FIG. 1.

DETAILED DESCRIPTION OF THE INVENTION

The present invention will be described in detail with reference to the accompanying drawings. The present invention provides a method for forming a self-aligned contact without key holes in the inter poly oxide layer using a two step contact layer deposition.

Keyhole Problem the Invention Solves

FIGS. 1, 2A through 6A, 2B through 6B, 7 and 8 show a process known by the inventor that causes Keyhole problems.

Figure 1:
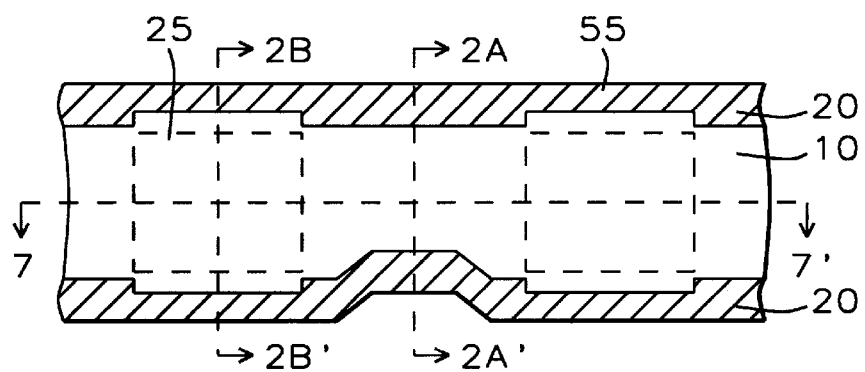
FIGS. 1 shows a top view of self aligned contacts illustrating a layout used in the present invention.

Referring to FIG. 1, the process begins by providing a semiconductor structure (7) for a semiconductor device, such as for a DRAM device. The semiconductor structure (7) has a conductive layer (8) (preferably a patterned polysilicon layer) thereover, and a first dielectric layer (9) (preferably an oxide layer) over the conductive layer (8).

Figure 8:
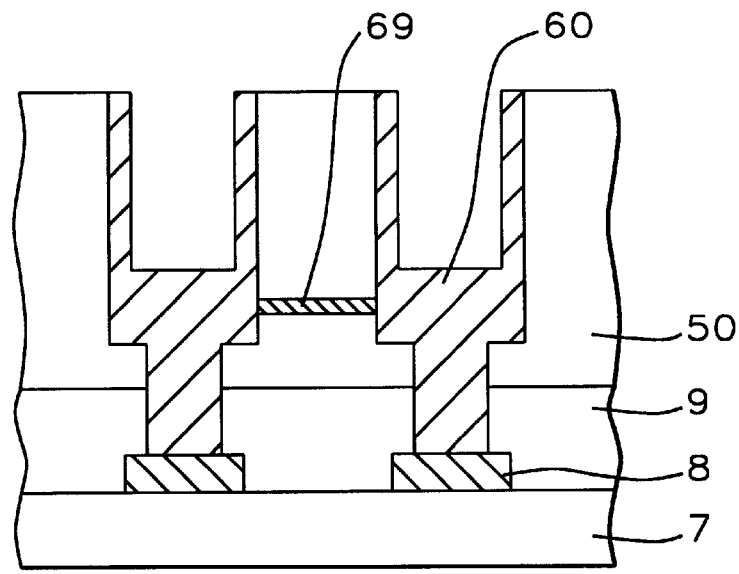

The first dielectric layer (9) has a conductive structure (20) thereover. The conductive structure (20) is preferably a line (such as a bit line) comprising a polysilicon layer (21) with a tungsten silicide layer (22) thereover as shown in FIGS. 2A, 2B, 3A and 3B. A hard mask (30) is located on the top of the tungsten silicide layer (22). The hard mask (30) is preferably composed of silicon nitride. The conductive structure (20) has sidewalls and a top. A contact area (25) is located on the conductive layer (8) adjacent to the conductive structure (20). As shown in FIG. 8, a conductive device (60), such as a capacitor crown, may be formed over a contact area (25) during subsequent processing.

Figures 2A, 2B:
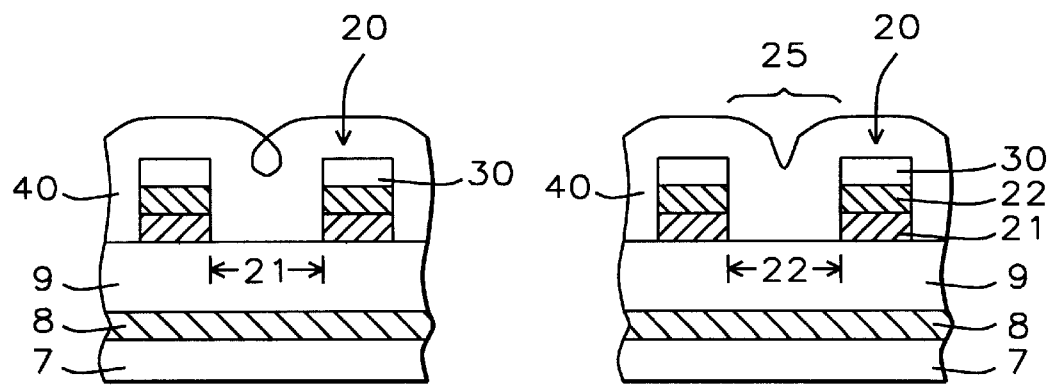
FIGS. 2A, 2B, 3A, 3B, 4A, 4B, 5A, 5B, 6A, 6B, 7 & 8 illustrate sequential sectional views of a current process for fabrication of a self-aligned contact.

Referring to FIGS. 2A & 2B, in the problem process, a sidewall spacer layer (40) is formed over the hard mask and the first dielectric layer (9). The sidewall spacer layer (40) is preferably composed of silicon nitride formed using plasma enhanced chemical vapor deposition (PECVD). Since the step coverage properties of PECVD are poor, an over-head issue (concave profile) occurs, which leads to a key hole (void) forming in during deposition of the subsequently formed second dielectric (e.g. IPO) layer.

Figure 3A:
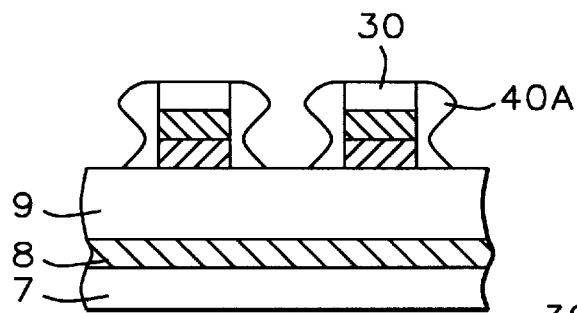
Figure 3B:
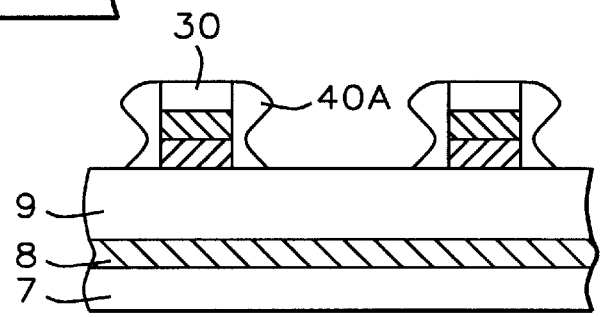

Referring to FIGS. 3A & 3B, the sidewall spacer layer (40) is etched using an anisotropic dry etch to form sidewall spacers (40A) on the sidewalls of the conductive structures (20). The surface of the sidewall spacers (40A) opposite the conductive structure (20) can have a concave profile (e.g. undercut, over-head) as shown in FIG. 2B. This concave profile is the result of etching the over-head sidewall spacer layer (40), and will induce the key hole in the second dielectric layer as discussed previously.

Figure 4A:
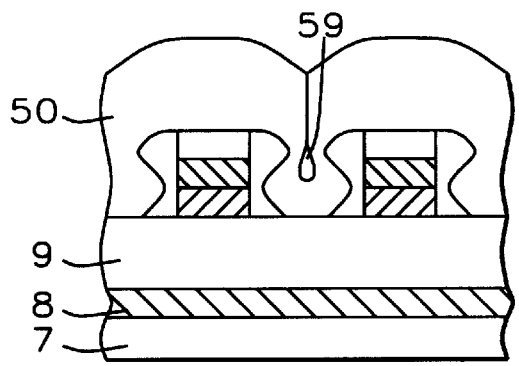
Figure 4B:
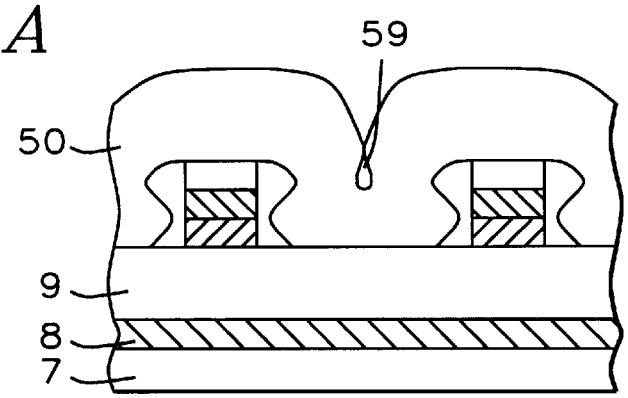

Referring to FIGS. 4A and 4B, a second dielectric layer (e.g. IPO layer) (50) is formed over the sidewall spacers (40A), the conductive structure (20), and the first dielectric layer (9). The IPO layer (50) is preferably formed using a low temperature PECVD process. As shown in FIG. 4A and FIG. 4B, the concave profile of the sidewall spacers (40A) causes a void (or key hole) (59) in the second dielectric layer (50).

Figure 5A:
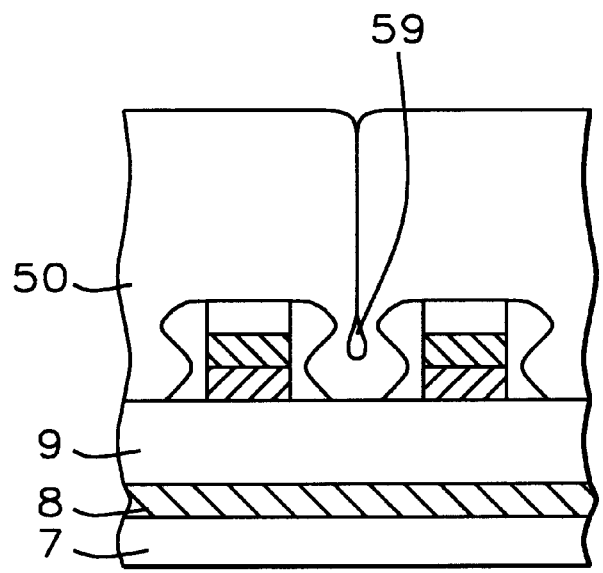
Figure 5B:
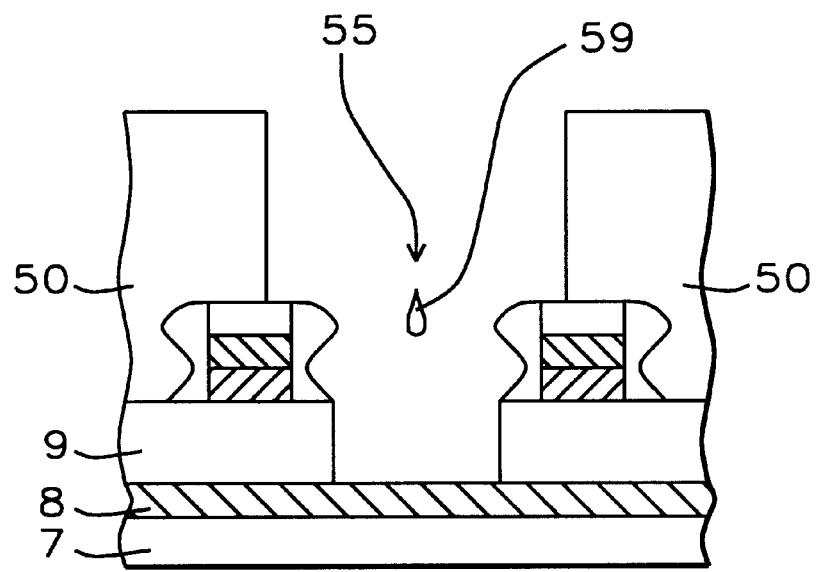
Figure 7:
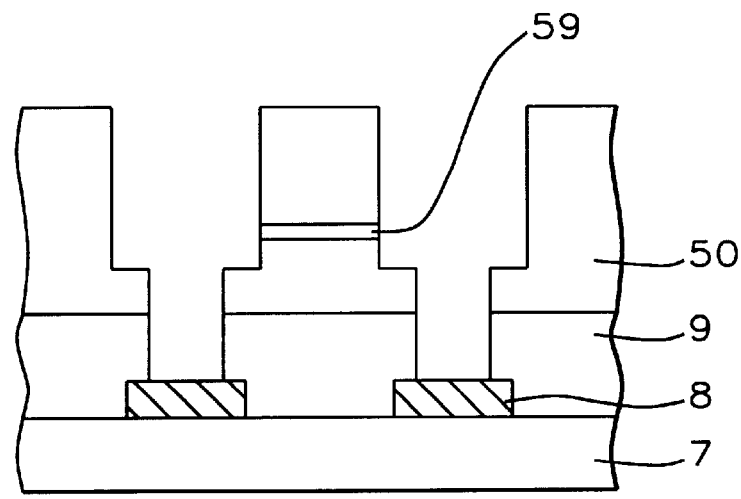

Referring to FIGS. 5A, 5B & 7, a contact opening (55) is formed in the second dielectric layer (50) and the first dielectric layer (9) over the contact area (25) using photolithography and etching. As shown in FIG 5A, the key hole 59 remains between the conductive structures (20) in the IPO layer (50) where it is not over the contact area (25).

Figure 6A:
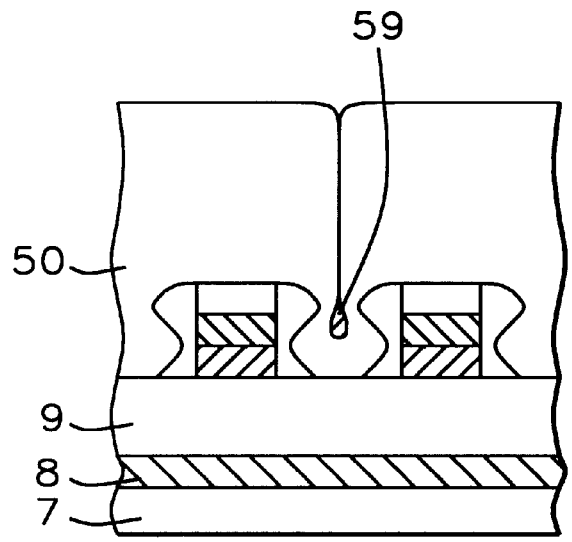
Figure 6B:
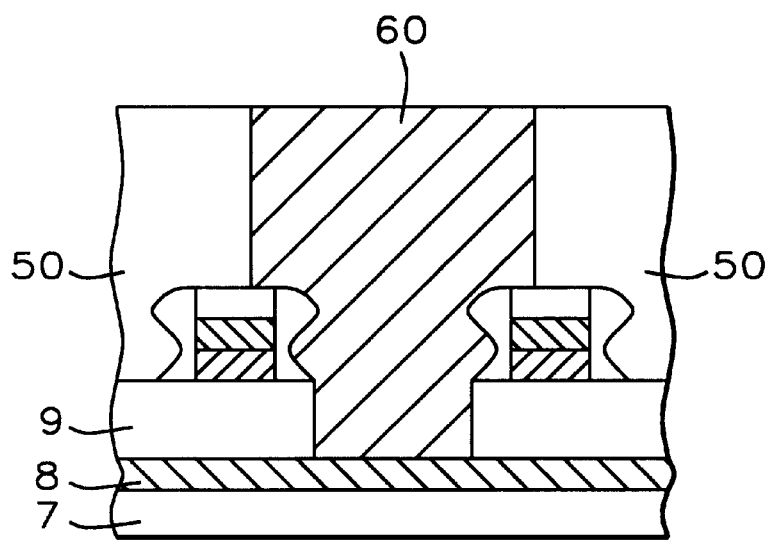

Referring to FIGS. 6A, 6B & 8, a contact (60) is formed in the contact opening (45). The contact is composed of a conductive material, preferably polysilicon. A key disadvantage of the current process is that the conductive material for the contact (60) can get into the key hole (59) in the IPO layer (50) as shown in FIG. 6A (69) causing an electrical short between devices such as crown capacitors formed over adjacent contacts.

Preferred Embodiment

In the preferred embodiment of the present invention, the process begins as previously described. However, the contact (60) is formed using a two-step contact layer deposition. The first contact layer (70) is a thin conductive layer with poor step coverage. The second contact layer (80) is a thicker conductive layer which can be used to form device structures such as capacitor crowns.

Referring to FIGS. 2A & 2B, the preferred embodiment begins by providing a semiconductor structure (7) for a semiconductor device, such as for a DRAM device. The semiconductor structure (7) has a conductive layer (8) (preferably a patterned polysilicon layer) thereover and a first dielectric layer (9) (preferably an oxide layer) over the conductive layer (8).

The first dielectric layer (9) has conductive structures (20) thereover. The conductive structures (20) are preferably a lines (such as a bit lines) comprising a polysilicon layer (21) with a tungsten silicide layer (22) thereover as shown in FIG. 3A. The conductive structures are spaced apart a width (21) of between 0.1 micrometers and 0.4 micrometers in a narrow section and are spaced a width (22) of between 0.2 micrometers and 0.5 micrometers in a contact area section.

A hard mask (30) is located on the top of the tungsten silicide layer (22). The hard mask is preferably composed of silicon nitride having a thickness of between about 100 Angstroms and 1000 Angstroms. The conductive structure (20) has sidewalls and a top. A contact area (25) is located on the conductive layer (8) adjacent to the conductive structure (20).

Still referring to FIG. 2A & 2B, a spacer layer (40) composed of silicon oxide is formed over the hard mask (30) and the first dielectric layer (9). The sidewall spacer layer (40) is preferably formed using a plasma enhanced chemical vapor deposition process at a temperature of between about 300° C. and 750° C. The sidewall spacer layer (40) is preferably formed to a thickness of between about 300 Angstroms and 3000 Angstroms.

Referring to FIG. 3A and 3B, the spacer layer (40) is anisotropically etched to form sidewall spacers (40A). The etch is performed using reactive ion etching with a chemistry selective to silicon nitride to prevent overetching of the hard mask (30). For example the etch chemistry could include $CHF_3$ and $O_2$ at low $O_2$ flow rate (i.e. less than 5% $O_2$ by volume).

A second dielectric layer (e.g. IPO layer) (50) is formed over the sidewall spacers (40A), the hard mask (30), and the first dielectric layer (9) leaving a key hole (59), as shown in FIGS. 4A, 4B & 7. Next, a contact opening (55) is formed in the second dielectric layer (50) and the first dielectric layer (9) over the contact area (25), as shown in FIG. 5B.

Figure 9:
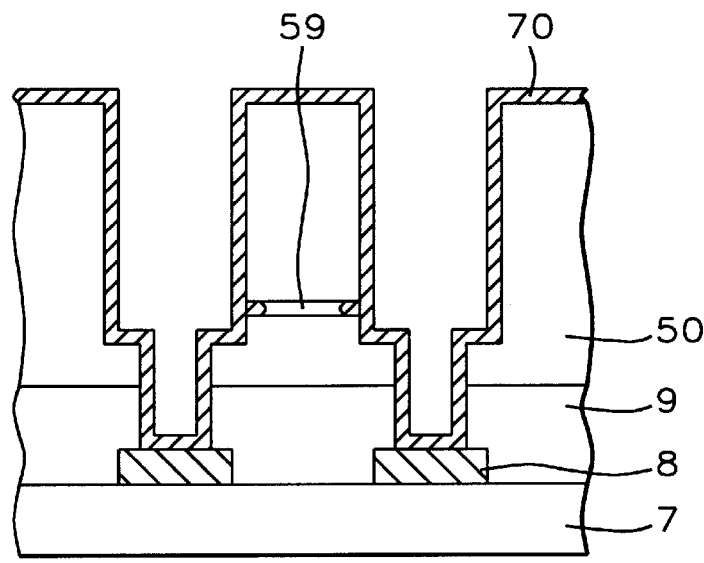
FIGS. 9 & 10 illustrate sequential sectional views of a process for fabrication of a self-aligned contact wherein the key hole is plugged by the first contact layer without being filled, thereby preventing an electrical short between adjacent conductive structures.

Referring to FIG. 9, the first contact layer deposition step forms a first contact layer (70) having poor step coverage properties, such as high temperature film (HTF). The poor step coverage properties result in a conformal step coverage wherein the thickness of the film is constant within 10% of its thickness. The first contact layer (70) is preferably doped in-situ using phosphine, arsine, or diborane. The first contact layer is doped at a concentration of between about 1E20 atm/cm$^3$ and 1E22 atm/cm$^3$. The first contact layer is deposited at a temperature of between about 550° C. and 700° C. The first contact layer (70) preferably has a thickness of between about 500 Angstroms and 1000 Angstroms.

A key advantage of the present invention is that, due to the poor step coverage properties of the first contact layer (70), the key hole (59) is plugged without being filled by the first contact layer (70). The ends of the keyhole (59) are covered by the first contact layer (70), but the conductive material which comprises the first contact layer (70), does not penetrate through the length of the keyhole (59). Because the keyhole (59) is not filled with conductive material, an electrical short is not created.

Figure 10:
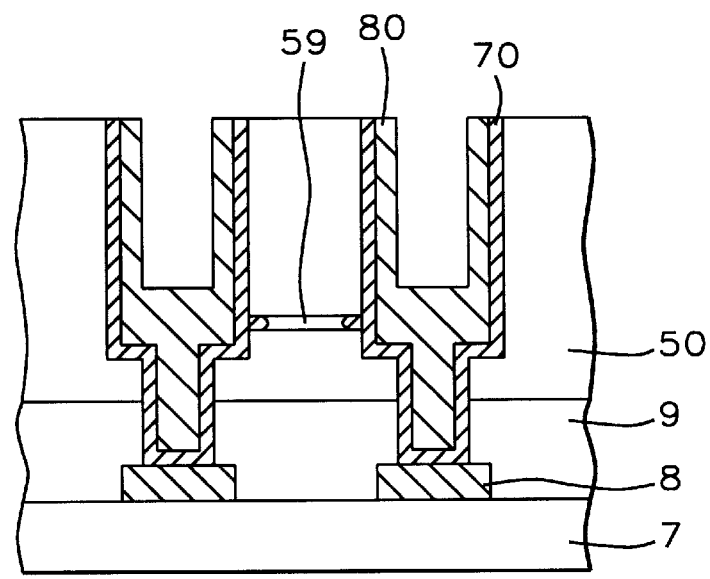

Referring to FIG. 10, the second contact layer (80) is formed on the first contact layer (70). The second contact layer (80) is preferably comprised of in-situ doped polysilicon having a thickness of between about 3000 Angstroms and 6000 Angstroms. The second contact layer (80) is preferably formed using a polysilicon deposition process at a temperature of between about 500° C. and 700° C. The second contact layer (80) is preferably doped in-situ using arsine, diborane or most preferably phosphine at a concentration of between about 1E19 atm/cm$^3$ and 1E22 atm/cm$^3$.

In the preferred embodiment, the first contact layer (70) and the second contact layer (80) can be formed into device structures such as capacitor crowns. Such device structures are free from electrical shorts because the keyhole (59) which is formed in the inter poly oxide layer (50) is plugged without being filled by the first contact layer (70).

While the invention has been particularly shown and described with reference to the preferred embodiments thereof, it will be understood by those skilled in the art that various changes in form and details may be made without departing from the spirit and scope of the invention.

What is claimed is:

1. A method for forming a self aligned contact, comprising the steps of:
    a. providing a semiconductor structure, having sequentially a first conductive layer, a first dielectric layer, and a conductive structure thereover; said conductive structure having sidewalls with sidewall spacers thereon; said first conductive layer having a contact area thereon adjacent to said conductive structure; said conductive structure comprising at least one conductive layer having a hard mask thereover;
    b. forming an second dielectric layer over said sidewall spacers, said hard mask, and said first dielectric layer; whereby a keyhole is formed in said second dielectric layer;
    c. forming a contact opening in said first dielectric layer and said second dielectric layer over said contact area;
    d. forming a first contact layer in said contact opening and over said second dielectric layer; said first contact layer having poor step coverage properties; whereby said keyhole is plugged without being filled; and
    e. forming a second contact layer over said first contact layer.

2. The method of claim 1 wherein said first contact layer has a thickness of between about 500 Angstroms and 1000 Angstroms and said second contact layer has a thickness of between about 3000 Angstroms and 6000 Angstroms.

3. The method of claim 1 wherein said first contact layer is composed of high temperature polysilicon film having a deposited at a temperature of between about 500° C. and 750° C. and is doped in-situ at a concentration of between about 1E20 atm/cm$^3$ and 1E22 atm/cm$^3$ and said second contact layer is composed of polysilicon film deposited at a temperature of between about 500° C. and 700° C. and is doped in-situ at a concentration of between about 1E19 atm/cm$^3$ and 1E22 atm/cm$^3$.

4. The method of claim 1 wherein said first contact layer has a uniform film thickness which varies by less than 10% of said film thickness.

5. The method of claim 1 which further includes planarizing said first contact layer and said second contact layer to form capacitor crowns; whereby said capacitor crowns are not electrically shorted to adjacent capacitor crowns through said keyholes.

6. A method for forming a self-aligned contact which is not electrically shorted to an adjacent self-aligned contact through a keyhole in the inter poly oxide layer, comprising the steps of:
    a. providing a semiconductor structure, having a first conductive layer over said semiconductor structure, a first dielectric layer over said first conductive layer, and a conductive structure over said first dielectric layer; said conductive structure having sidewalls with sidewall spacers thereon; said first conductive layer having a contact area thereon adjacent to said conductive structure; said conductive structure comprising at least one conductive layer having a hard mask thereover;
    b. forming a spacer layer over said hard mask and said first dielectric layer;
    c. anisotropically etching said spacer layer to form first sidewall spacers on said sidewalls of said conductive structure;
    d. forming a second dielectric layer over said sidewall spacers, said hard mask, and said semiconductor structure; whereby a keyhole is formed in said second dielectric layer;
    e. forming a contact opening in said second dielectric layer and said first dielectric layer over said contact area;
    f. forming a first contact layer in said contact opening and over said second dielectric layer; said first contact layer having conformal step coverage properties, whereby said keyhole is plugged without being filled; and
    g. forming a second contact layer over said first contact layer.

7. The method of claim 6 wherein said first contact layer has a thickness of between about 500 Angstroms and 1000 Angstroms and said second contact layer has a thickness of between about 3000 Angstroms and 6000 Angstroms.

8. The method of claim 7 wherein said first contact layer is composed of high temperature polysilicon film deposited at a temperature of between about 550° C. and 700° C. and doped in-situ at a concentration of between about 1E20 atm/cm$^3$ and 1E22 atm/cm$^3$ and said second contact layer is composed of polysilicon film deposited at a temperature of between about 500° C. and 700° C. and doped in-situ at a concentration of between about 1E19 atm/cm$^3$ and 1E22 atm/cm$^3$.

9. The method of claim 6 wherein said first contact layer has a uniform film thickness which varies by less than 10% of said film thickness.

10. The method of claim 6 which further includes planarizing said first contact layer and said second contact layer to form capacitor crowns; whereby said capacitor crowns are not electrically shorted to adjacent capacitor crowns through said keyholes.

11. A method for forming a self-aligned contact which is not electrically shorted to an adjacent self-aligned contact through a keyhole in the inter poly oxide layer, comprising the steps of:
    a. providing a semiconductor structure, having a first conductive layer over said semiconductor structure, a first dielectric layer over said first conductive layer, and a conductive structure over said first dielectric layer; said conductive structure having sidewalls with sidewall spacers thereon; said first conductive layer having a contact area thereon adjacent to said conductive structure; said conductive structure comprising at least one conductive layer having a hard mask thereover;
    b. forming a spacer layer over said hard mask and said first dielectric layer;
    c. anisotropically etching said spacer layer to form first sidewall spacers on said sidewalls of said conductive structure;

d. forming a second dielectric layer over said sidewall spacers, said hard mask, and said semiconductor structure; whereby a keyhole is formed in said second dielectric layer;

e. forming a contact opening in said second dielectric layer and said first dielectric layer over said contact area;

f. forming a first contact layer in said contact opening and over said inter poly oxide layer; said first contact layer having a thickness of between about 100 Angstroms and 1000 Angstroms and being composed of in-situ doped polysilicon having poor step coverage properties; whereby said keyhole is plugged without being filled;

g. forming a second contact layer over said first contact layer; said second contact layer having a thickness of between about 3000 Angstroms and 6000 Angstroms and being composed of in-situ doped polysilicon having good step coverage properties; and h. planarizing said first contact layer and said second contact layer to form capacitor crowns; whereby said capacitor crowns are not electrically shorted to adjacent capacitor crowns through said keyholes.

12. The method of claim 11 wherein said first contact layer is composed of high temperature polysilicon film deposited at a temperature of between about 550° C. and 700° C. and doped in-situ at a concentration of between about 1E20 atm/cm$^3$ and 1E22 atm/cm$^3$ and said second contact layer is composed of polysilicon film deposited at a temperature of between about 500° C. and 700° C. and doped in-situ at a concentration of between about 1E19 atm/cm$^3$ and 1E22 atm/cm$^3$.

13. The method of claim 11 wherein said first contact layer has a uniform film thickness which varies by less than 10% of said film thickness.

* * * * *